(12) United States Patent
Jinno et al.

(10) Patent No.: US 6,750,086 B2
(45) Date of Patent: *Jun. 15, 2004

(54) SEMICONDUCTOR DEVICE HAVING A SEMICONDUCTOR THIN FILM CONTAINING LOW CONCENTRATION OF UNBOUND HYDROGEN ATOMS AND METHOD OF MANUFACTURING THE SAME

(75) Inventors: Yushi Jinno, Gifu (JP); Shiro Nakanishi, Ogaki (JP); Kyoko Hirai, Hashima (JP); Tsutomu Yamada, Ogaki (JP); Yoshihiro Morimoto, Inazawa (JP); Kiyoshi Yoneda, Motosu-gun (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/049,353

(22) Filed: Mar. 27, 1998

(65) Prior Publication Data

US 2002/0072157 A1 Jun. 13, 2002

(30) Foreign Application Priority Data

Mar. 28, 1997 (JP) .............................................. 9-078317

(51) Int. Cl.[7] ........................... H01L 21/00; H01L 21/84
(52) U.S. Cl. ....................................... 438/151; 438/162
(58) Field of Search ................................ 430/151, 162

(56) References Cited

U.S. PATENT DOCUMENTS 5,313,076 A    5/1994  Yamazaki et al.
5,366,926 A  * 11/1994  Mei et al. .................. 438/487

(List continued on next page.)

FOREIGN PATENT DOCUMENTS

| JP | 04-311038  | 11/1992 |
| JP | 05-90294   | 4/1993  |
| JP | 05-275699  | 10/1993 |
| JP | 07-142743  | 3/1995  |
| JP | 08-31765   | 2/1996  |
| JP | 09-26602   | 1/1997  |

OTHER PUBLICATIONS

Bonnel et al., "Comparison of the Hydrogenation Techniques on Polysilicon TFTs", IEEE Colloqium on Poly–Si Devices and Applications, pp. 22/1–22/4. 1993, month unknown.*

(List continued on next page.)

Primary Examiner—John F. Niebling
Assistant Examiner—Ron Pompey
(74) Attorney, Agent, or Firm—Hogan & Hartson, LLP

(57) ABSTRACT

In a fabrication process of a semiconductor device for use in a TFT liquid crystal display system, before the start of crystallizing amorphous silicon (a-Si), dehydrogenation annealing is carried out to not only decrease the density of hydrogen in the p-Si film (13) to $5 \times 10^{20}$ atoms/cm$^3$ at most but also to prevent crystallization of the a-Si film (13) being obstructed due to possible excessive hydrogen remaining in the film. With the p-Si film (13) covered with an interlayer insulation film (15) in the form of a plasma nitride film, annealing is then carried out in nitrogen atmosphere at a temperature of 350° C. to 400° C. for one to three hours, more preferably 400° C. for two hours. The result is that hydrogen atoms in the p-Si film (13) efficiently terminate dangling bonds of the film and hence do not become excessive, thus improving the electrical characteristics of the semiconductor device.

15 Claims, 16 Drawing Sheets

U.S. PATENT DOCUMENTS

| | | | |
|---|---|---|---|
| 5,445,676 A | | 8/1995 | Takagi |
| 5,529,951 A | * | 6/1996 | Noguchi et al. |
| 5,534,445 A | * | 7/1996 | Tran et al. ............... 438/162 |
| 5,545,571 A | | 8/1996 | Yamazaki et al. |
| 5,571,744 A | * | 11/1996 | Demirlioglu et al. ....... 438/217 |
| 5,572,047 A | | 11/1996 | Hiroki et al. |
| 5,632,820 A | | 5/1997 | Taniyama et al. |
| 5,899,709 A | | 5/1999 | Yamazaki et al. |
| 6,020,224 A | | 2/2000 | Shimogaichi et al. |

OTHER PUBLICATIONS

Pollack et al., "Hydrogen Passivation of Polysilicon MOSFET's From a Plasma Nitride Source", IEEE Electron Device Letters, vol. EDL–5, No. 11, pp. 468–470, Nov. 1984.*

* cited by examiner

SEMICONDUCTOR DEVICE HAVING A SEMICONDUCTOR THIN FILM CONTAINING LOW CONCENTRATION OF UNBOUND HYDROGEN ATOMS AND METHOD OF MANUFACTURING THE SAME

BACKGROUND OF THE INVENTION

1. Field of the Invention

The present invention relates to a semiconductor device such as a liquid crystal display (LCD), and more particularly to an LCD of the integrated-driver-circuit type in which a thin film transistor (TFT) using a polycrystalline semiconductor layer is formed in the display section and the peripheral section. The also invention relates to a method of manufacturing such a semiconductor device.

2. Description of the Related Art

In recent years, liquid crystal display systems (LCD) have been increasingly put into practice in the office automation and audio-visual equipment industries in view of the significant advantages of downsizing and reduced equipment requirements, as well as reduced power consumption. In particular, an active-matrix-type LCD, in which TFTs are arranged in a matrix, each acting as a switching element for controlling the timing for overwriting image information in the individual pixel, enables a huge-size display screen and a high-resolution animation display and is hence used as a high-quality display system for various types of television sets and personal computers.

A TFT is a field effect transistor (FET) which can be obtained by forming a semiconductor and a metal layer in a predetermined island pattern over an insulating substrate. In an active-matrix-type LCD, a pair of pixel capacitors for driving liquid crystal are respectively formed on a pair of substrates between which the liquid crystal is sandwiched, and a TFT is connected to one electrode of each pixel capacitor.

Attempts have been made to improve the performance of LCDS. To this end, an LCD has been developed in which a polysilicon (p-Si) film is used as a substitute for amorphous silicon (a-Si) film, which has been widely used in various conventional LCDS, and annealing using laser beam irradiation is carried out for formation or growth of p-Si grains. Generally, p-Si is high in mobility compared to a-Si so that TFT can be downsized, thus realizing a high aperture ratio and a high resolution. Further, since high speed TFT can be achieved due to the gate-self-align structure and the reduced parasitic capacitance, it is possible to obtain a high-speed driver circuit by forming CMOS comprising n-channel TFT and p-channel TFT. It is therefore possible to realize a reduced manufacturing cost and downsizing of the LCD module.

To form the p-Si film on an insulating substrate, it has currently been customary 1) to recrystallize the a-Si film, which has been formed at low temperature, by annealing at high temperature, or 2) to employ solid phase growth at high temperature. In either case, since the process is subject to a relatively high temperature in excess of 900° C., a quartz glass substrate is needed as the insulating substrate in view of its high heat-resistance although there is the drawback that it is expensive. In the meantime, an alternative method employing laser-annealing has been developed in which silicon crystallization is carried out at a relatively low substrate temperature not exceeding 600° C. so as to be able to use an inexpensive alkaliless glass as the insulating substrate. The fabrication process whose process temperature does not exceed 600° C. throughout all of the steps of manufacturing the TFT substrate is called the low-temperature process, and is essential to mass production of low-price LCDs.

A silicon film to be formed on such an insulating substrate would not be a single crystal film but usually takes on an amorphous or a polycrystalline structure. These non-single crystal silicon film contains a large number of dangling bonds which do not bond covalently. Such dangling bonds have a trap level in the forbidden band. Since electrons are caused to move between the valence band and the conduction band via the trap level, a transistor using such a film would be high in on resistance and low in off resistance and hence low in on-off ratio. To solve this problem, it is currently known to terminate the dangling bonds with hydrogen atoms. Namely, hydrogen gas activated during or after formation of the non-single-crystal silicon is introduced to link hydrogen atoms with the dangling bonds, thereby causing the trap levels to disappear.

FIG. 1 of the accompanying drawings is a cross-sectional diagram showing a sectional structure of such a p-Si TFT; on the left side is an n-channel TFT and on the right side is a p-channel TFT. On a substrate 10, a gate electrode 11 of metal such as chromium is formed and a gate insulation film 12 of, for example, silicon nitride ($SiN_N$) and/or silicon oxide ($SiO_2$) is formed so as to cover the gate electrode 11. A p-Si film 23 is formed on the gate insulation film 12. For the n-channel TFT, this p-Si film 23 has a lightly doped region LD containing n-type impurities at a low density ($N^-$) utilizing the edge of an implantation stopper 14 of $SiO_2$ patterned in the shape of the gate electrode 11 on the p-Si film 23, and source and drain regions S, D located outside the lightly doped region LD and containing the n-type impurity at a high density ($N^+$),. For the p-channel TFT, source and drain regions 23S, 23D contain p-type impurities at a high density ($P^+$). In either of the n- and p-channel TFTs, an intrinsic layer substantially devoid of impurities and serving as a channel region CH is located beneath the implantation stopper 14. Further, an interlayer insulation film 15 such as $SiN_N$ is formed so as to cover these regions of the p-Si film 23, and on the interlayer insulation film 15, source and drain electrodes 16, 17 of metal are formed and are connected to the source and drain regions 23S, 23D, respectively, via contact holes in the interlayer insulation film 15. In the pixel region, a non-illustrated liquid-crystal-driving electrode in the form of a transparent conductive film such as indium tin oxide (ITO) is formed on the interlayer insulation film 18 covering the source and drain electrodes 16, 17 and is connected to the source electrode 16.

In the n-channel TFT, the structure having the LD region 23LD located between the source and drain regions 23S, 23D and the channel region CH is called an LDD (lightly doped drain). In an LCD, such an LDD structure is employed for the purpose of controlling the off current. As an alternative, a double gate structure in which the gate electrode 11 and the channel region CH are formed in series may be employed with the same result.

The channel regions CH may be doped with different impurities, whose conduction types are opposite to conduction type of each TFTS, before the above-mentioned impurity implantation; the resulting TFT is called a channel-dope type TFT.

The fabrication process of this TFT will now be described. Firstly, on a relatively low heat-resisting substrate 10 such as alkaliless glass, a gate electrode 11 is formed by sputtering chromium and then etching the chromium film, whereupon a gate insulation film 12 is continuously formed of silicon nitride (SiN$_N$) and silicon oxide (SiO$_2$) as well as amorphous silicon (a-Si) by plasma CVD, without breaking the vacuum at all. Hydrogen in a-Si, which prevent crystallization, is then removed by dehydrogenation annealing, whereupon a polysilicon (p-Si) film 23 is formed by polycrystallizing a-Si at a temperature not exceeding the resisting temperature of the substrate 10 using excimer laser annealing (ELA). Further, a silicon oxide (SiO$_2$) film is formed over the p-Si film 23 and then a positive photoresist is formed over the SiO$_2$ film, whereupon the photoresist is exposed to light irradiation from the substrate side, which is so-called reverse side exposure. As the result of this reverse side exposure, the photoresist is photosensitized in such a manner that a pattern reflecting the shadow of the pattern shape of the gate electrode 11 is inverted. Subsequently, the photoresist is developed, and then with the resulting photoresist as a mask, the insulation film is etched to form the implantation stopper 14 in the same shape as the gate electrode 11. Then, with the implantation stopper 14 (photoresist) as a mask, impurity ions, such as phosphorus (P), whose conduction type is n, are doped at a low density to form a channel region CH beneath the implantation stopper 14 and a pair of lightly doped regions 23LD, one on each of opposite sides of the implantation stopper 14. After that, the photoresist is shaped into a larger size than that of the implantation stopper 14, and with the resulting photoresist as a mask, n-type impurity ions are doped at a high density to form source and drain regions 23S, 23D. As a result, for the n-channel TFT, an LDD (lightly doped drain) structure is completed in which the lightly doped (LD) region LD is located between the channel region CH and the source and drain regions 23S, 23D.

For the p-channel TFT, like the n-channel TFT, reflecting the pattern shape of the gate electrode 11, source and drain regions 23S, 23D doped with p-type impurities at a high density are formed outside the channel region CH. However, in the case of the p-channel TFT, an LDD structure is not employed.

Further, excimer laser annealing or lamp annealing is carried out to recover the crystallinity of the p-Si film 23 doped with the impurities and also to cause activation for lattice replacement of the impurity atoms.

The p-Si film 13 is then patterned in regions needed for TFT and an interlayer insulation film 15 such as SiO$_2$ is formed so as to cover the n- and p-channel TFTs, whereupon a hydrogen plasma process is carried out to introduce hydrogen atoms into the p-Si film 23. After that, contact holes are formed and then source and drain electrodes 16, 17 are formed by forming a film of metal such as aluminum (Al)/molybdenum (Mo) over the contact holes and etching the metal film and are connected to the source and drain regions 23S, 23D, respectively, via the corresponding contact holes. A second interlayer insulation film 18 of silicon nitride (SiN$_N$) is also formed, whereupon thermal annealing is carried out to terminate hydrogen in the p-Si film 23 to the dangling bonds of the film.

Such a hydrogenation process for terminating the dangling bonds in a semiconductor film with hydrogen atoms is exemplified by a hydrogen plasma. This hydrogen plasma process generates a plasma arc in a hydrogen atmosphere to activate hydrogen so that the activated hydrogen is added into the semiconductor film. However, as described below in detail, a hydrogen plasma process would not improve the electrical characteristics of the semiconductor device and would in fact change the characteristics for the worse, which presumably originates from the excessively high density of hydrogen. That is, if more hydrogen ions than those to be terminated in the dangling bonds exist in the semiconductor film, they would change the flat band voltage to invite a change of the threshold. Further, the on current would be lowered due to the carrier effect of the charged ions, and in the meantime, the off current would be increased or energy distribution would vary to cause the electrical characteristics to fluctuate for every semiconductor device.

Furthermore, as is common practice, such a hydrogen plasma process has been performed selectively (1) by utilizing a plasma CVD apparatus or (2) by a dedicated apparatus. In the former, in which hydrogen gas is introduced by generating plasma, although it is possible to acknowledge a high degree of technological maturity and good uniformity, it would encounter the following problems: namely, the plasma CVD apparatus itself is expensive and it is difficult to secure good conduct speed in single wafer processing. In the latter, which consists of an anneal furnace and a helical coil, although it is possible to perform batch processing for better throughput and to reduce the manufacturing cost somewhat using a relatively inexpensive apparatus, it is still unable to solve the problems of the apparatus itself being less mature and good uniformity being difficult to achieve.

SUMMARY OF THE INVENTION

With the foregoing problems in mind, it is an object of the present invention to provide a semiconductor device with a semiconductor film having excellent uniformity and characteristics, and also to a method of manufacturing such a semiconductor device.

According to a first aspect of the invention, the above object is accomplished by a semiconductor device comprising: an insulator substrate; and a semiconductor film disposed on an upper surface of the substrate and containing a specified number of hydrogen atoms equal to or less than the number of dangling bonds in the semiconductor film.

The present invention prevents the hydrogen atoms not bound with dangling bonds from, being electrically affected, which would result in adverse effects on the electrical characteristics of the semiconductor device.

Preferably the semiconductor film is a polysilicon film in which hydrogen is contained in a specified density equal to or less than $5 \times 10^{20}$ atoms/cm$^3$.

Having this hydrogen density, the hydrogen atoms contained in the polysilicon film are bound with the dangling bonds in the polysilicon film with an adequately high probability so that the hydrogen atoms not bound with dangling bonds and likely having an adverse effect on the electrical characteristics of the semiconductor device can be prevented from existing in the polysilicon film.

According to a second aspect of the invention, a method of manufacturing a semiconductor device comprises the steps of: forming a semiconductor film on a surface of a substrate, decreasing the density of the hydrogen atoms in the semiconductor film by removing the hydrogen atoms from the semiconductor film using an annealing process; and after the annealing process, treating the semiconductor film with a process for preventing penetration of any excessive hydrogen atoms into the semiconductor film.

Using this method, the hydrogen atoms contained in the semiconductor device are prevented from becoming excessive, so that the hydrogen atoms not bound with dangling bonds are prevented from adversely affecting the electrical characteristics of the semiconductor device.

According to a third aspect of the invention, a method of manufacturing a semiconductor device comprises the steps of: forming a semiconductor film on a surface of a substrate; forming a silicon nitride film over the semiconductor film; and treating the substrate with a thermal annealing process under nitrogen atmosphere after the forming of the silicon nitride film.

Since the substrate is treated with the thermal annealing process after forming the silicon nitride film, an appropriate quantity of the hydrogen atoms contained in the silicon nitride film would move into the semiconductor film to terminate the dangling bonds in the semiconductor film, thus improving the electrical characteristics of the semiconductor device.

In the present invention, the silicon nitride film is preferably formed by plasma CVD. Using plasma CVD, it is possible to form a high-uniformity silicon nitride film over the semiconductor film and hence to increase the uniformity of density of hydrogen atoms to be supplied from inside the silicon nitride film into the semiconductor film.

According to a fourth aspect of the invention, a method of manufacturing a semiconductor device comprises the steps: forming an amorphous silicon film on a surface of a substrate; decreasing the density of hydrogen atoms, which are contained in the amorphous silicon film by removing the hydrogen atoms from the amorphous silicon film by a annealing process; then forming a polysilicon film by polycrystallizing the amorphous semiconductor film by another annealing process; forming a silicon nitride film over the polysilicon film by plasma CVD; and treating the substrate with a thermal annealing process under nitrogen atmosphere after the forming of the silicon nitride film.

If a polysilicon film is obtained by polycrystallizing the amorphous silicon film by this method, it is possible to prevent the density of hydrogen atoms finally contained in the polysilicon film from becoming excessive. Further, the thermal annealing process causes an appropriate quantity of the hydrogen atoms, which had been contained in the silicon nitride film, to move into the polysilicon film to terminate to dangling bonds in the polysilicon film, thus improving the electrical characteristics of the semiconductor device employing the polysilicon film.

According to a fifth aspect of the invention, a method of manufacturing a thin film transistor comprises the steps of: forming a gate electrode on a surface of a substrate; forming a gate insulating film and a non-crystalline silicon film in the described order over the substrate so as to cover the gate electrode; decreasing the density of hydrogen atoms, which are contained in the non-crystalline silicon film, by removing the hydrogen atoms from the non-crystalline silicon film by an annealing process; forming a polysilicon film by polycrystallizing the non-crystalline silicon film by another annealing process; patterning the polysilicon film in a predetermined shape and then forming an impurity-doped region at a predetermined area in the patterned polysilicon film; after the forming of the impurity-doped region, forming a silicon nitride film so as to cover the patterned polysilicon film by plasma CVD and then treating the substrate, on which the polysilicon film and the silicon nitride film have been formed, with a thermal annealing process under nitrogen atmosphere; after the thermal annealing process, removing selected portions of the silicon nitride film in such a manner that a surface of the impurity-doped region in the polysilicon film is exposed; and forming a source electrode and a drain electrode in the exposed portions of the impurity-doped region to thereby connect the source electrode and the drain electrode to the impurity-doped region at their corresponding portions.

By this method, it is possible to obtain a polysilicon film by polycrystallizing the non-crystalline silicon film, which defines the active region of a thin film transistor, and to prevent the density of the hydrogen atoms contained in the obtained polysilicon film becoming excessive. Further, the thermal annealing process causes an appropriate quantity of the hydrogen atoms, which had been contained in the silicon nitride film, to move into the polysilicon film to terminate the dangling bonds in the polysilicon film, thus improving the electrical characteristics of the semiconductor device employing the polysilicon film.

In the present invention, the above-mentioned individual thermal annealing process is preferably carried out at a substrate temperature of 350° C. to 400° C. for one to three hours. More preferably, the individual thermal annealing process is carried out at a substrate temperature of approximately 400° C. for approximately two hours. By carrying out the thermal annealing process under these conditions, it is possible to supply an optimum quantity of hydrogen atoms into the semiconductor film or the polysilicon film.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The principles of the present invention are particularly useful when applied to fabrication process of a semiconductor device, various preferred embodiments of which will now be described in detail more with reference to the accompanying drawings. Like reference numbers or alpha-numeric characters designate similar parts or elements throughout several diagrams.

FIGS. 2A to 2G are cross-sectional diagrams showing a succession of process steps of a polysilicon (p-Si) TFT manufacturing method according to a first embodiment of the present invention.

Figure 1:
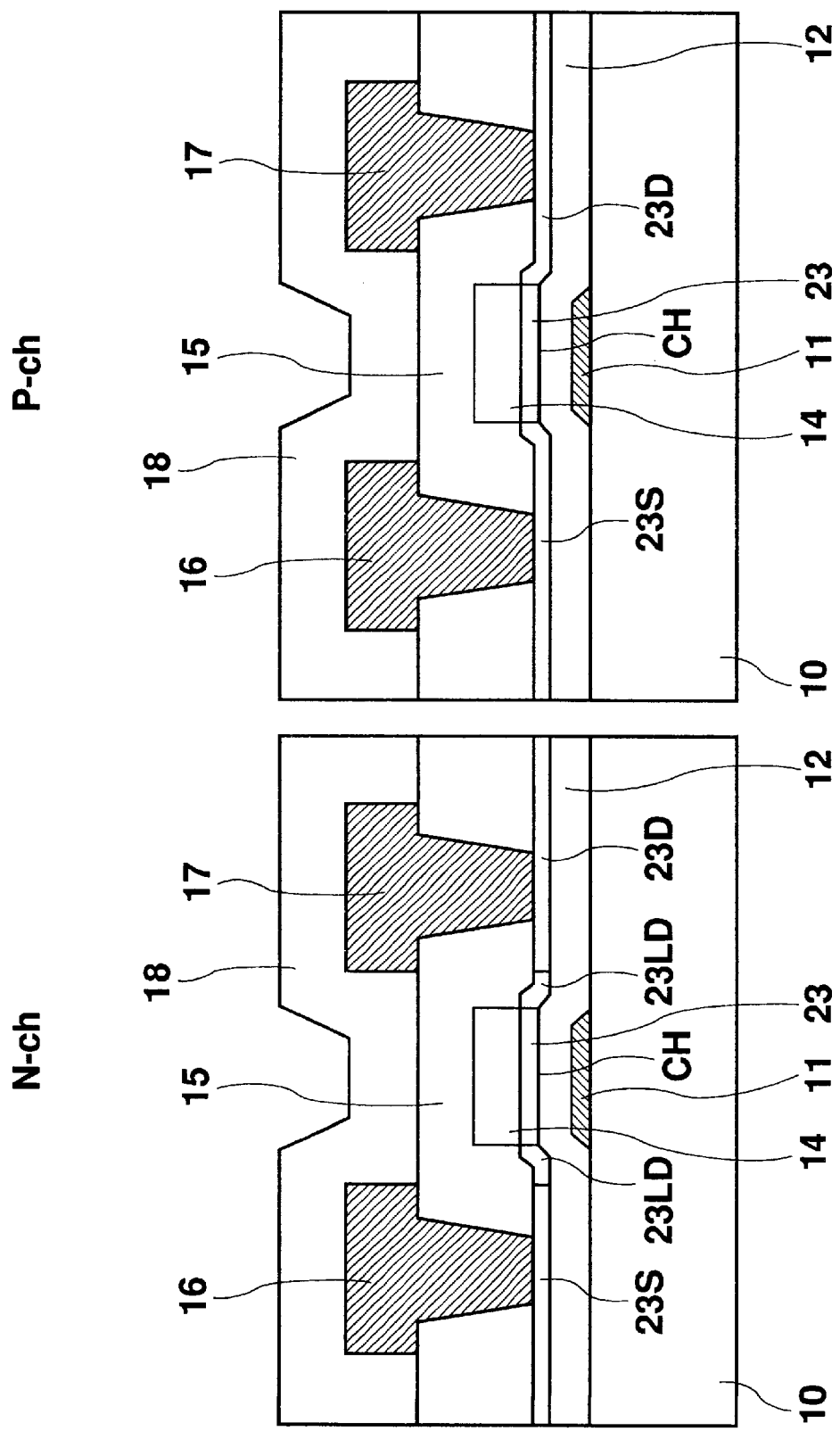
FIG. 1 is a cross-sectional diagram of a conventional semiconductor device.
Figure 2A:
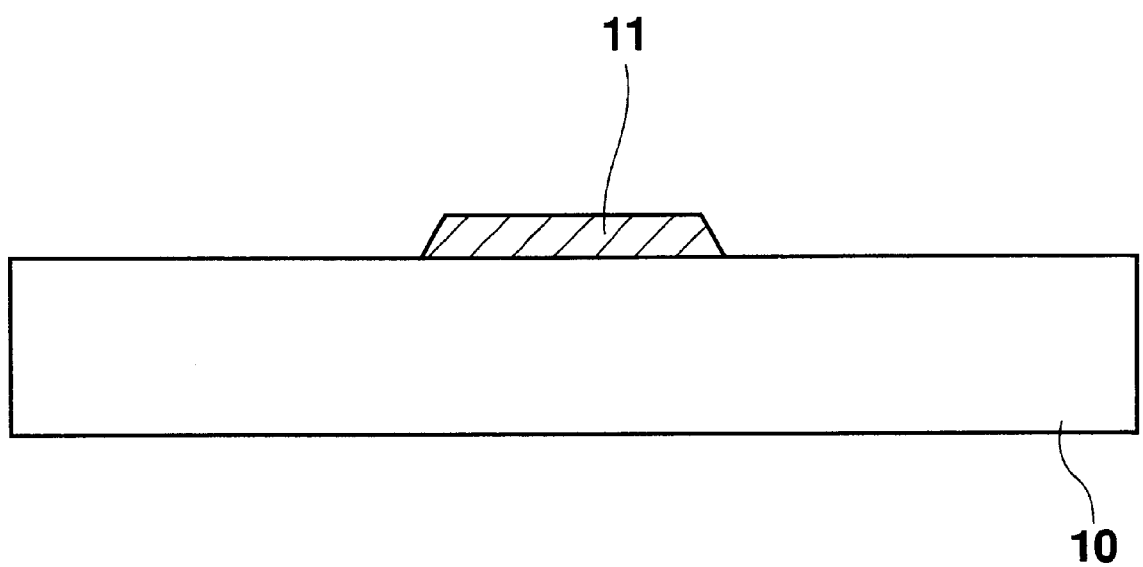
FIGS. 2A, 2B, 2C, 2D, 2E, 2F and 2G are process diagrams showing a fabrication process of a semiconductor device according to an embodiment of the present invention.

In FIG. 2A, a chromium (Cr) film is formed on an upper surface of an insulator substrate (hereinafter also called the substrate) 10 and then the chromium film is etched to form a gate electrode 11. The gate electrode 11 is formed integrally with a gate line, which serves as a scanning-signal supply line.

Figure 2B:
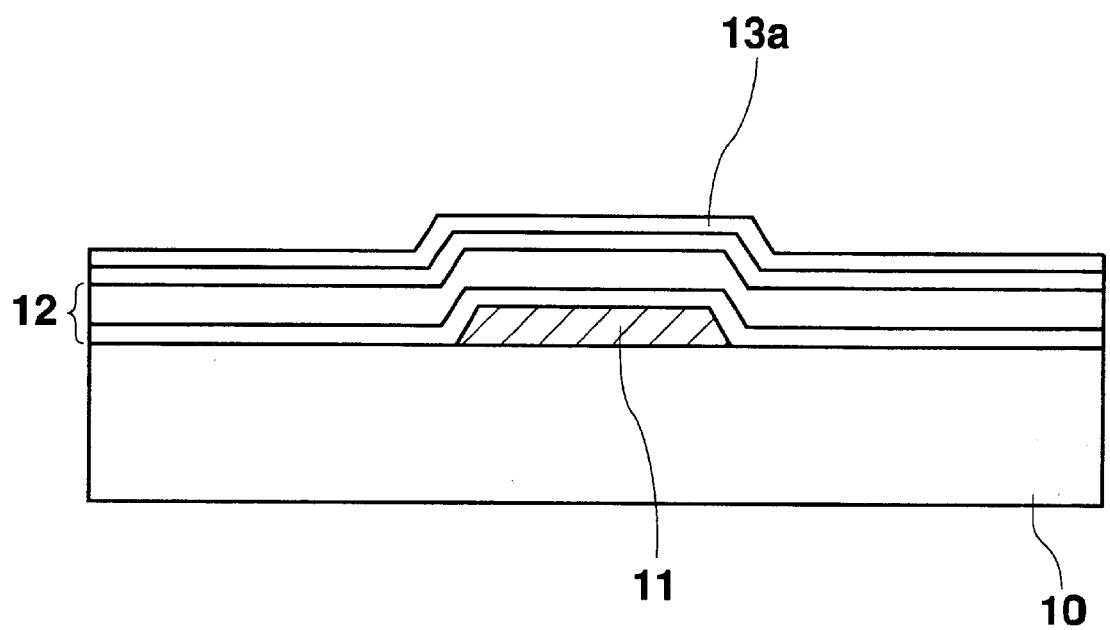

In FIG. 2B, a gate insulating film 12 of silicon nitride ($SiN_N$) and silicon oxide ($SiO_2$) and an amorphous silicon (a-Si) film 13a are formed one after another over the entire upper surface of the substrate 10 by CVD so as cover the gate electrode 11. Then, to remove a large number of hydrogen atoms contained in the a-Si film 13a, dehydrogenation annealing is carried out at a substrate temperature of 400° C. for two hours. It is common knowledge that hydrogen acts as an obstacle during polycrystallization of the a-Si film;. Consequently, this annealing process decreases the number of hydrogen atoms to a hydrogen density of approximately $5\times10^{20}$[atoms/cm$^3$]. Another purpose of this annealing process is to prevent excessive hydrogen atoms failing to be terminated to the dangling bonds and hence deteriorating the electrical characteristics.

Figure 2C:
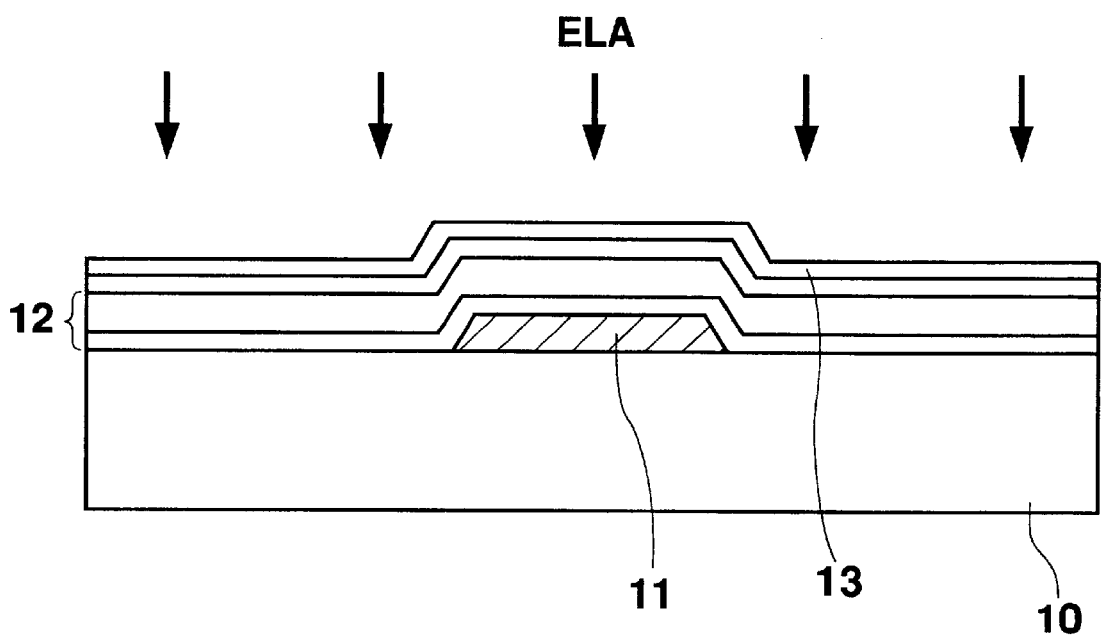

In FIG. 2C, the a-Si film is polycrytallized by excimer laser annealing (ELA)to form a polysilicon (p-Si) film 13. At that time, hydrogen atoms contained in the p-Si film 13 are removed a little bit more.

Figure 2D:
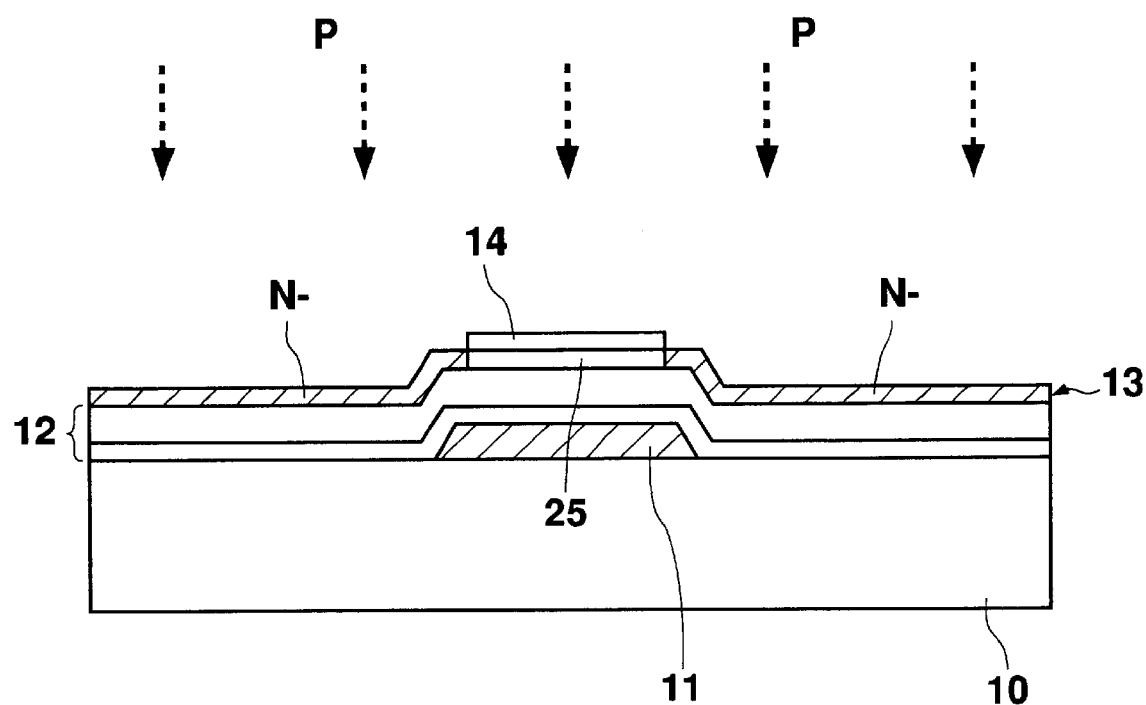

In FIG. 2D, a SiO$_2$ film is formed on the p-Si film 13 formed over the substrate 10, and the SiO$_2$ film is then patterned by the reverse side exposure method. Namely, a photoresist is formed only on the SiO$_2$ film in a pattern, which is reflected from the pattern of the gate electrode 11, by photosensitizing the resist on the SiO$_2$ film with the gate electrode 11 used as a pattern mask. Then, with the photoresist as a mask, the SiO$_2$ film is etched into a shape similar to that of the gate electrode 11. As a result, an implantation stopper 14 is obtained. With the implantation stopper 14 as a mask, ion implantation of phosphor (P), which takes on the n-type conduction, is then carried out with respect to the p-Si film 13 by a low dosage of approximately $10^{13}$ to dope the entire region except the area covered with the implantation stopper 14 at a low density (N$^-$). At that time, the region beneath the implantation stopper 14, namely, the region directly above the gate electrode 11 is maintained in the intrinsic layer as a channel region 25 of TFT. The photoresist used in patterning the implantation stopper 14 may be stripped before and after ion implantation but should remain during ion implantation.

Figure 2E:
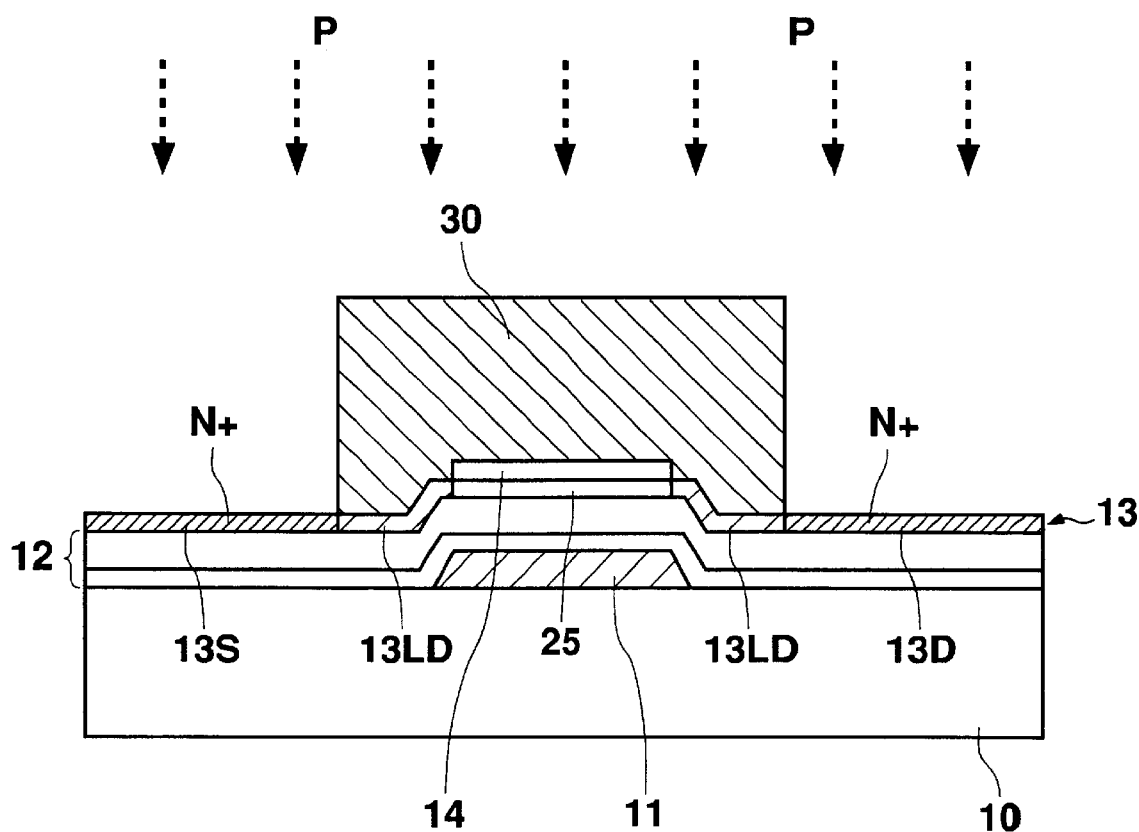

In FIG. 2E, a photoresist 30 larger than the gate electrode 11 is formed at least in a channel length direction (horizontally in FIG. 2E), and then, with the photoresist 30 as a mask, ion doping of phosphor (P) is carried out with respect to the p-Si film 13 at a high dosage of approximately $10^{15}$ to dope the entire region of the p-Si film 13 except the area covered with the photoresist 30 at a high density (N$^+$). At that time, in the area beneath the photoresist 30, the lightly doped region (N$^-$) and the channel region (N$^+$), which were formed in the previous process step of FIG. 2D, remain. As a result, after the high-density ion doping, an LDD structure is formed in which high-doped source and drain regions 13S, 13D exist one on each side of the channel region 25 so as to keep a lightly doped LD region 13LD between the high-doped source region 13S and the channel region 25 and a lightly doped LD region 23LD between the high-density drain region 13D and the channel region 25.

After the photoresist 30 has been stripped, an active annealing process is carried out by excimer laser annealing in order to recover crystallinity of the p-Si film doped with impurity ions and also to replace lattice impurities.

Figure 2F:
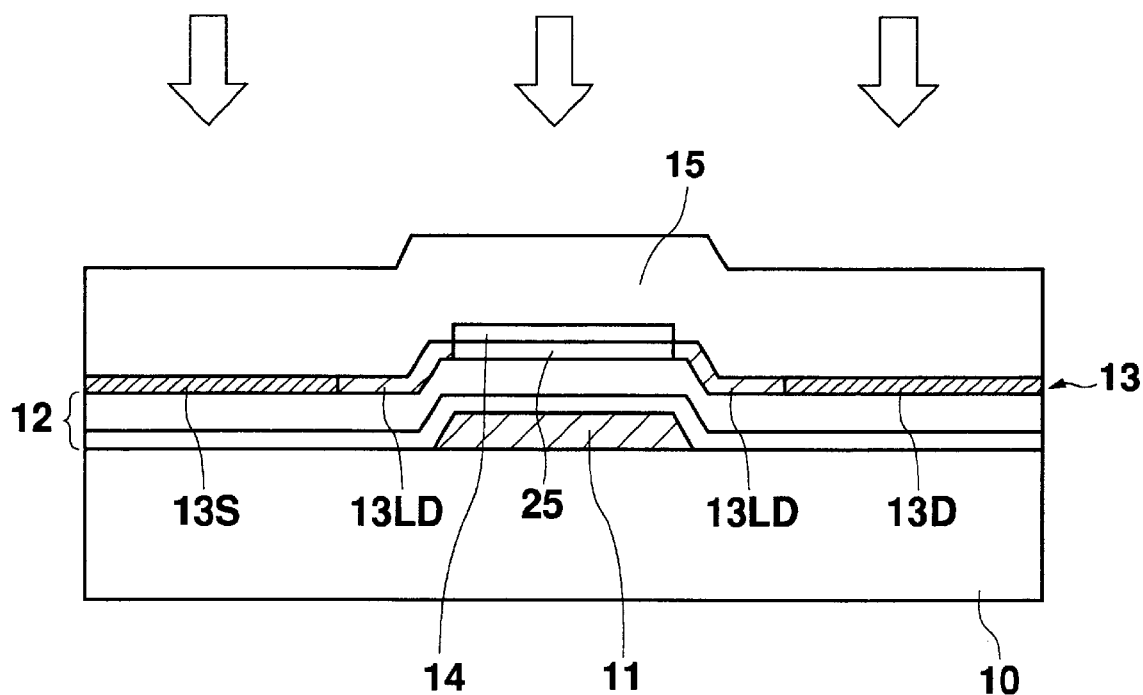

In FIG. 2F, for fabrication of TFT, the p-Si film 13 is etched so as to leave only necessary regions in an island pattern unetched, whereupon a silicon nitride (SiN$_x$) film is formed as an interlayer insulation layer 15 by plasma CVD. Thermal annealing is carried out in a nitrogen atmosphere at a substrate temperature of 350° C. to 400° C. for one to three hours, preferably at 400° C. for two hours. As the result of this thermal annealing process, hydrogen in the plasma nitride film, i.e., in the interlayer insulation film 15, is diffused in and throughout the transistor device and especially the p-Si film 13 so that hydrogen atoms (H) are terminated to dangling bonds in the p-Si film 13, and after that hydrogen in the transistor device will no longer be removed or separated out of the transistor device.

Figure 2G:
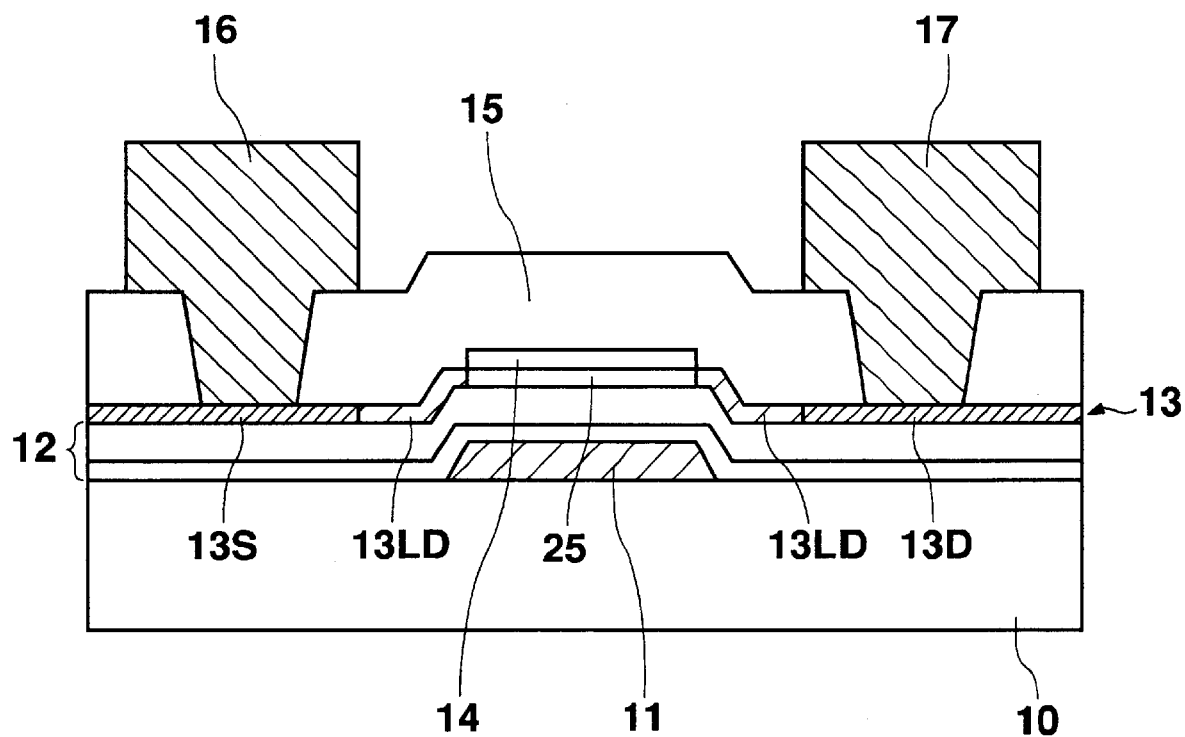

In FIG. 2G, contact holes are provided in the interlayer insulation film 15 to expose the source and drain regions 13S, 13D formed in the p-Si film 13, whereupon firstly a film such as aluminum (Al)/molybdenum (Mo) is formed over the entire top surface of the substrate 10 and is then etched so as to leave the vicinity of the contact holes unetched. As the result of this etching, a source electrode 16 is connected to the source region 13S via the corresponding contact hole and a drain electrode 17 is connected to the drain region 13D via the corresponding contact hole.

At that time, from the results of an inspection using the SIMS method, it turned out that the density of hydrogen in the p-Si film 13 did not exceed $5\times10^{20}$ atoms/cm$^3$. The same results of inspection would be obtained if the FT-IR method is used as an alternative.

The thus fabricated thin film transistor is particularly useful when used as, for example, a switch device for driving the individual liquid crystal pixel in the display of a liquid crystal display system, or a driver circuit device for driving such switch device. If they are to be used as driver circuit devices, many thin film transistors have had a complementary metal oxide semiconductor (CMOS) structure.

In this embodiment, since hydrogen atoms whose number is approximately equal to the number of dangling bonds in a semiconductor film are introduced into the semiconductor film by thermal annealing in a nitrogen atmosphere at a substrate temperature of 350° C. to 400° C. for one to three hours, it is possible to improve the characteristics of a thin film transistor to be fabricated so that a liquid crystal display system having excellent display performance can be obtained by using this thin film transistor as a driving liquid-crystal-pixel or a driver circuit device.

Figure 3:
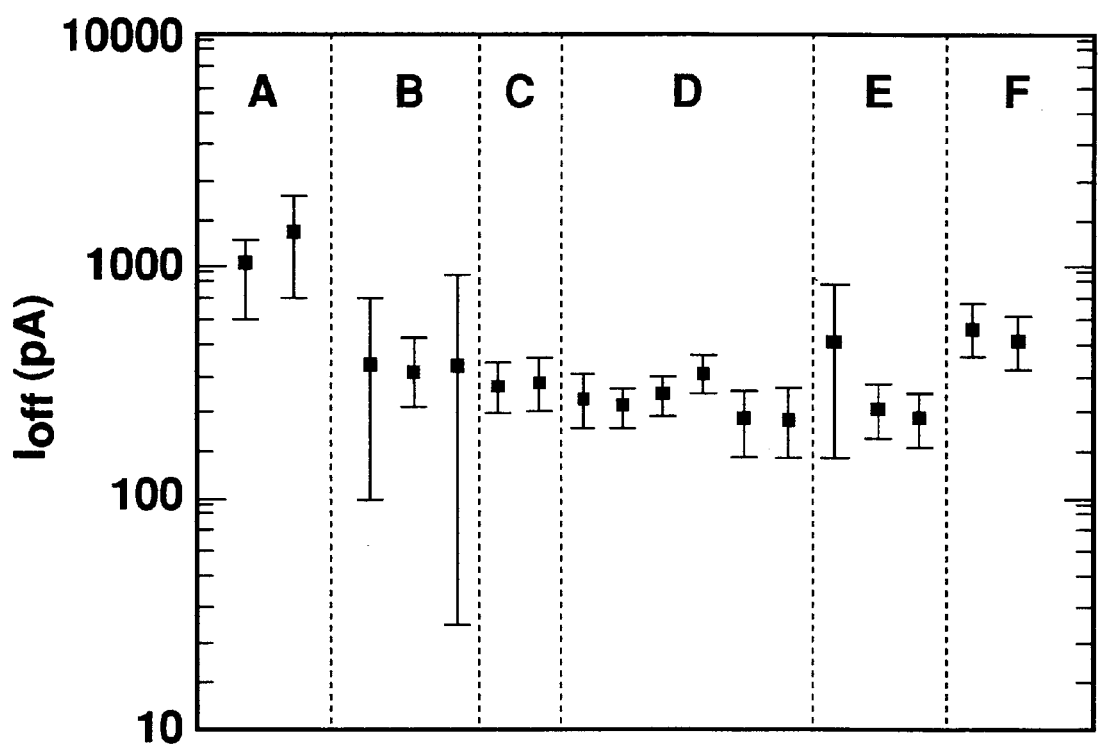
FIGS. 3, 4, 5, 6 and 7 are characteristic graphs showing the parameters of n-channel TFTs respectively fabricated under various fabrication conditions.

The following are the results of experiments conducted under the direction of the present inventors on the relationship between the condition for introducing hydrogen into the semiconductor film and the electrical characteristics of the thin film transistor:

FIG. 3 is a characteristic graph showing a range of dispersion and an average value of the off current (I$_{off}$) [pA] of each of ten TFTs with a p-Si film fabricated in one substrate under various hydrogen-introducing conditions. In the experiments, these ten object semiconductor devices were divided into six groups individually named A, B, C, D, E and F as shown in FIG. 3. The TFTs of group A were those in which annealing was not carried out in a nitrogen atmosphere after the p-Si film had been formed. The TFTs of group B were those in which annealing was carried out in a nitrogen atmosphere at a substrate temperature 400° C. for one hour after the p-Si film had been patterned into necessary regions. The TFTs of group C were those in which annealing was carried out in a nitrogen atmosphere at a substrate temperature of 350° C. for two hours after patterning of the p-Si film in the same manner. The TFTs of group D were those in which annealing was carried out in a nitrogen atmosphere at 400° C. for two hours. The TFTs of group E were those in which annealing was carried out in a nitrogen atmosphere at 400° C. for three hours. Further, regarding the TFTs of group F, the p-Si film treated with a conventional hydrogen plasma process as patterned and then annealed in a nitrogen atmosphere at 350° C. for one hour.

In this experiment, TFT, the channel width was 6 μm and the channel length 10 μm long in double-gate construction. A gate voltage of −6 V and a drain voltage of 10 V were applied to every TFT, and the off current was measured at that time.

It will be understood from FIG. 3 that the TFTs of F group, namely, those treated with a conventional hydrogen plasma process, were relatively high in the off current ($I_{off}$) compared to those of almost all of the remaining groups B, C, D and E in which no hydrogen plasma process took place. On the other hand, in the TFTs of each of groups B–E in which annealing in a nitrogen atmosphere took place, the off current was low. Especially in the TFTs of group D in which annealing in a nitrogen atmosphere took place at 400° C. for two hours, the off current was generally restricted to a lower level and was definitely small in a range of dispersion.

FIGS. 4 to 7 show a range of dispersion and an average value of the individual characteristic values (i.e., on current $I_{on}$, operating threshold $V_{th1}$, $V_{th2}$, swing S) of each of ten TFTs with a p-Si film fabricated under various conditions similar to those described in connection with FIG. 3. In this experiment, for every n-channel TFT, the channel width was 20 μm and the channel length was 7 μm, and the LD length was 1 μm.

Figure 4:
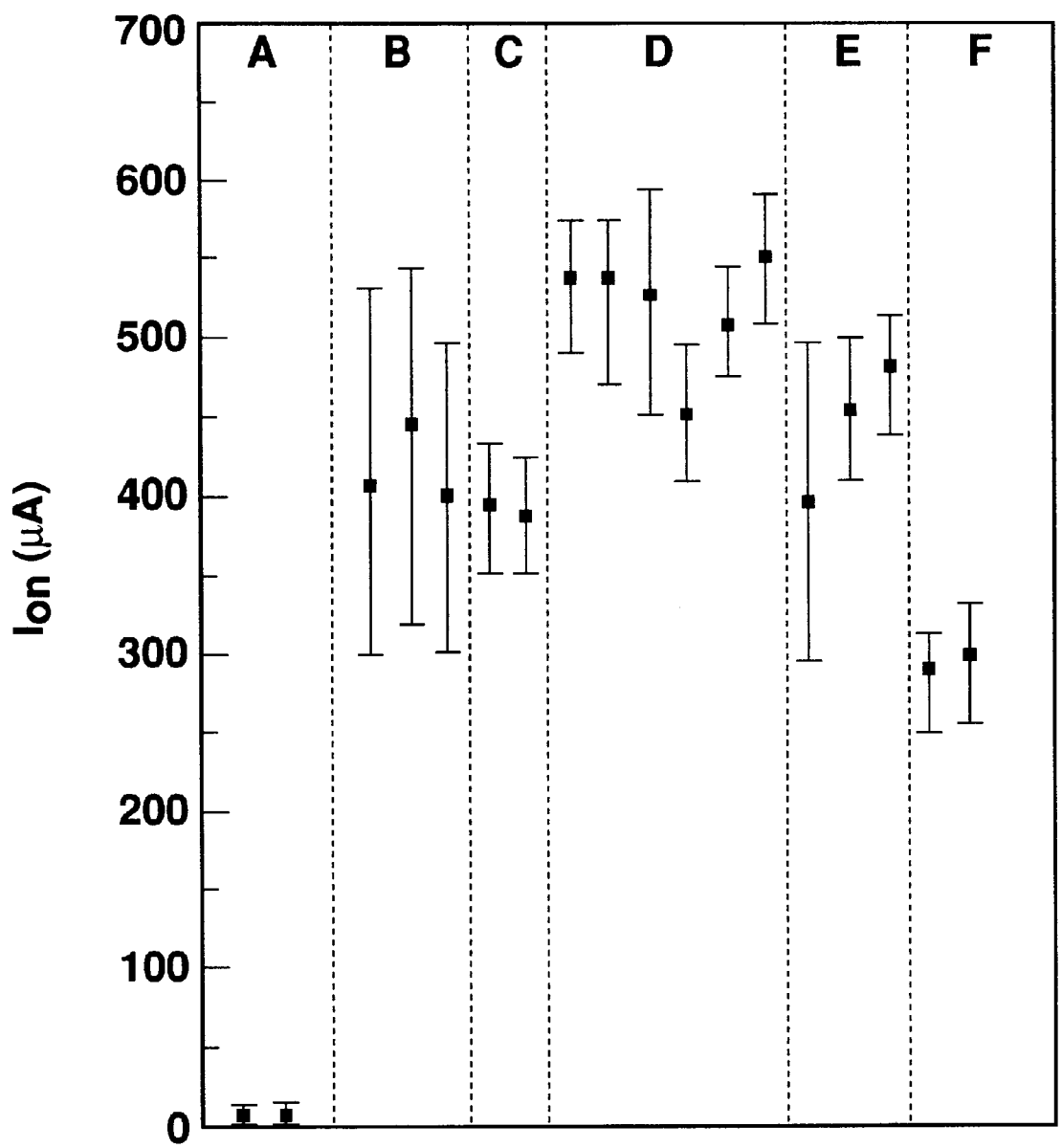

FIG. 4 is a characteristic graph showing values of the on current ($I_{on}$) when either of the gate and drain voltages was 15V. From FIG. 4, it will be understood that either when annealing did not take place in a nitrogen atmosphere (group A) or when a hydrogen plasma process took place (group F), the on current ($I_{on}$) was remarkably small compared to the remaining groups B, C, D and E in which the individual TFTs were treated by annealing in a hydrogen atmosphere. It will also be understood that when annealing took place in a nitrogen atmosphere but at 400° C. for two hours (group D), the on current ($I_{on}$) had a maximum average value and a small range of dispersion.

Figure 5:
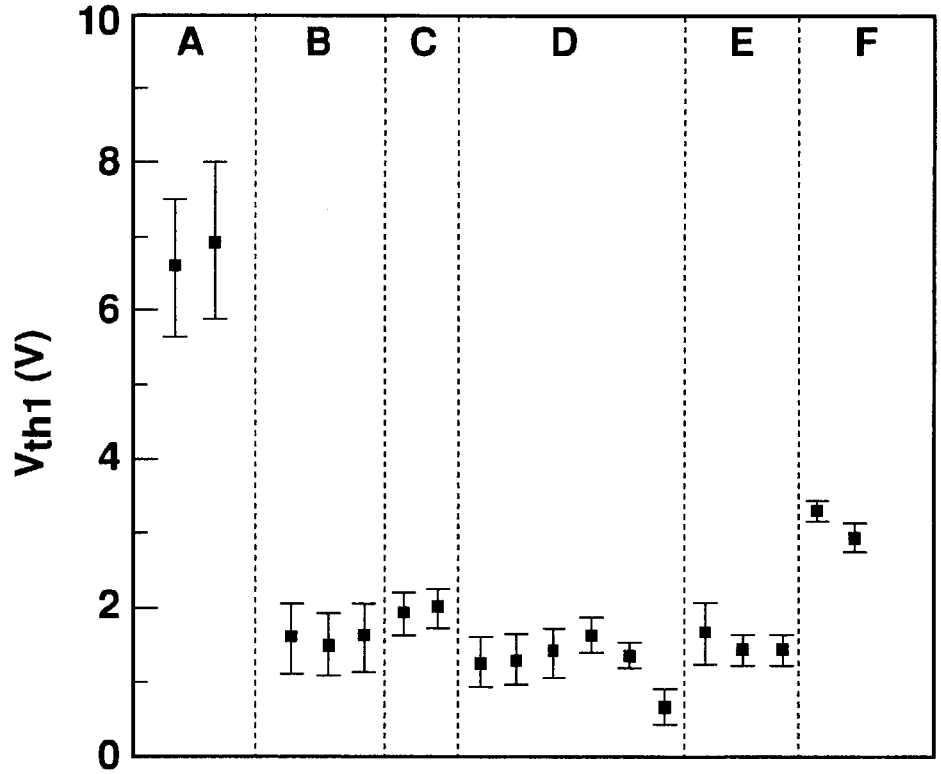

FIG. 5 is a characteristic graph showing values of the threshold ($V_{th1}$) when the drain voltage and current were 10V and 0.29 μA. From FIG. 5, it will be understood that either when annealing did not take place in a nitrogen atmosphere (group A) or when a hydrogen plasma process took place (group F), the threshold ($V_{th1}$) was remarkably high compared to the remaining groups B, C, D and E which the individual TFTs were treated by annealing in hydrogen atmosphere. It is also understood that when annealing took place in a nitrogen atmosphere but at 400° C. for two hours (group D), the threshold ($V_{th1}$) had a minimum average value and a small range of dispersion.

Figure 6:
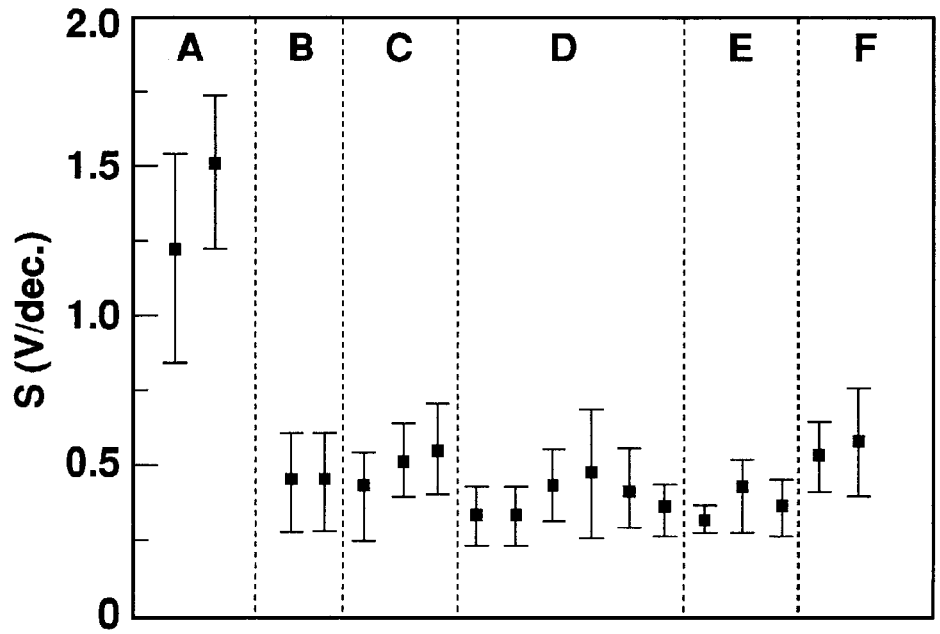

FIG. 6 is a characteristic graph showing various values of the swing (S) representing a sub-threshold characteristic in terms of the change of the gate voltage when the drain voltage was 5V and the drain current was varied from $10^{-9}$ A to $10^{-8}$ A. From FIG. 6, it will be understood that either when annealing did not take place in a nitrogen atmosphere (group A) or when a hydrogen plasma process took place (group F), the swing value (S) was high compared to the remaining groups B, C, D and E which the individual semiconductor devices were treated by annealing in a hydrogen atmosphere. It is also understood that when annealing took place in a nitrogen atmosphere but at 400° C. (group D), relatively low swing values (S) were obtained.

Figure 7:
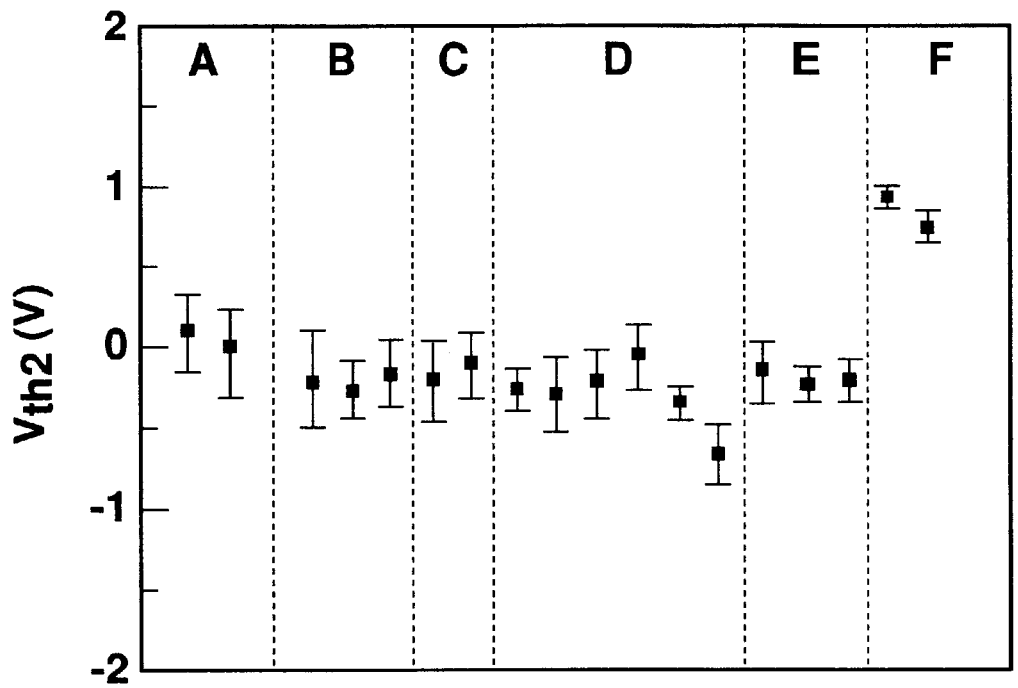

FIG. 7 is a characteristic graph showing values of the threshold ($V_{th2}$) when the drain voltage and current were 0.1V and 2.9 pA. From FIG. 7, it will be understood that when a hydrogen plasma process took place (group F), the threshold ($V_{th2}$) was high compared to almost all of the remaining groups B, C, D and E which the individual TFTs were treated by annealing in a hydrogen atmosphere and also to group A which were treated by neither annealing nor a hydrogen plasma process. It is also understood that generally when annealing took place in a nitrogen atmosphere, low thresholds ($V_{th2}$) were obtained, and especially when the same annealing took place at 400° C. for two hours (group D), the threshold ($V_{th2}$) was had a minimum average value.

From the results of this experiment, it will be understood that annealing in a nitrogen atmosphere was more effective than treating with a hydrogen plasma process in order to improve various electrical characteristics of a polysilicon thin film transistor (p-Si TFT) and was optimal especially when the same annealing took place at 400° C. for two hours.

FIGS. 8 to 11 show a range of dispersion and an average value of the individual characteristic values (i.e., on current $I_{on}$, operating threshold $V_{th1}$, $V_{th2}$, swing S) of each of ten p-ch TFTs with a p-Si film fabricated under various conditions similar to those described in connection with FIGS. 4 to 7. In this experiment, for every p-channel TFT, the channel width was an 20 μm and the channel length was 7 μm.

Figure 8:
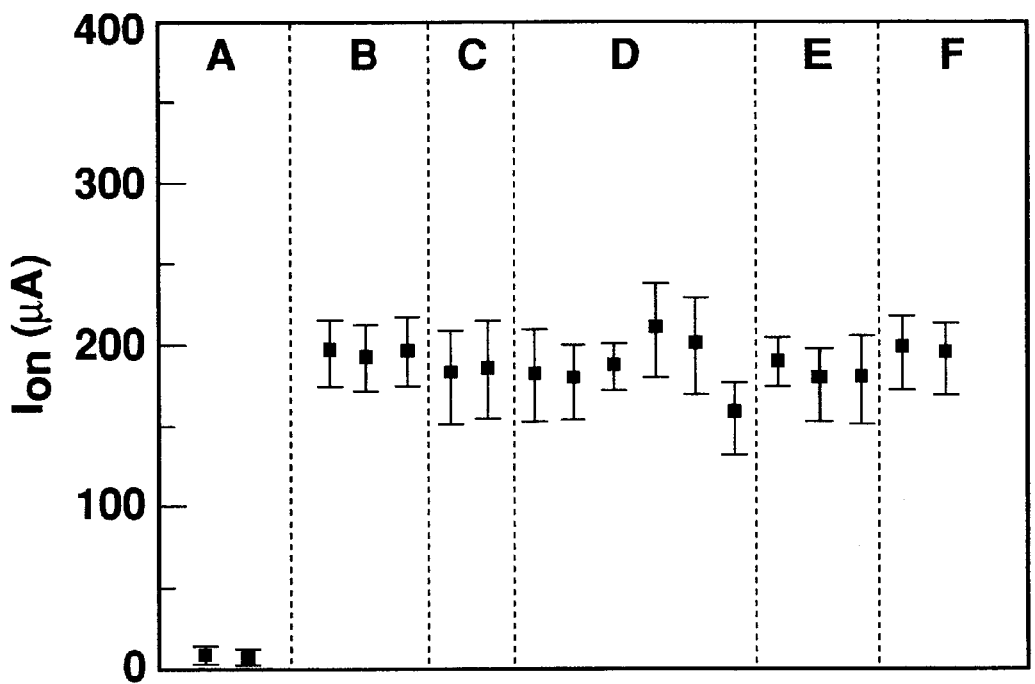
FIGS. 8, 9, 10 and 11 are characteristic graphs showing the parameters of p-channel TFTs respectively fabricated under various fabrication conditions.

FIG. 8 is a characteristic graph showing values of the on current ($I_{on}$) when either of the gate and drain voltages was −15V. From FIG. 8, it will be understood that when annealing took place in a nitrogen atmosphere (groups B, C, D and E), the on current (Ion) showed a tendency to decrease slightly compared to when a hydrogen plasma process took place (group F), but the values of the on current were substantially the same level as the case of group F. Still in the case of groups B, C, D and E, the on current ($I_{on}$) was remarkably large compared to when annealing did not take place (group A).

Figure 9:
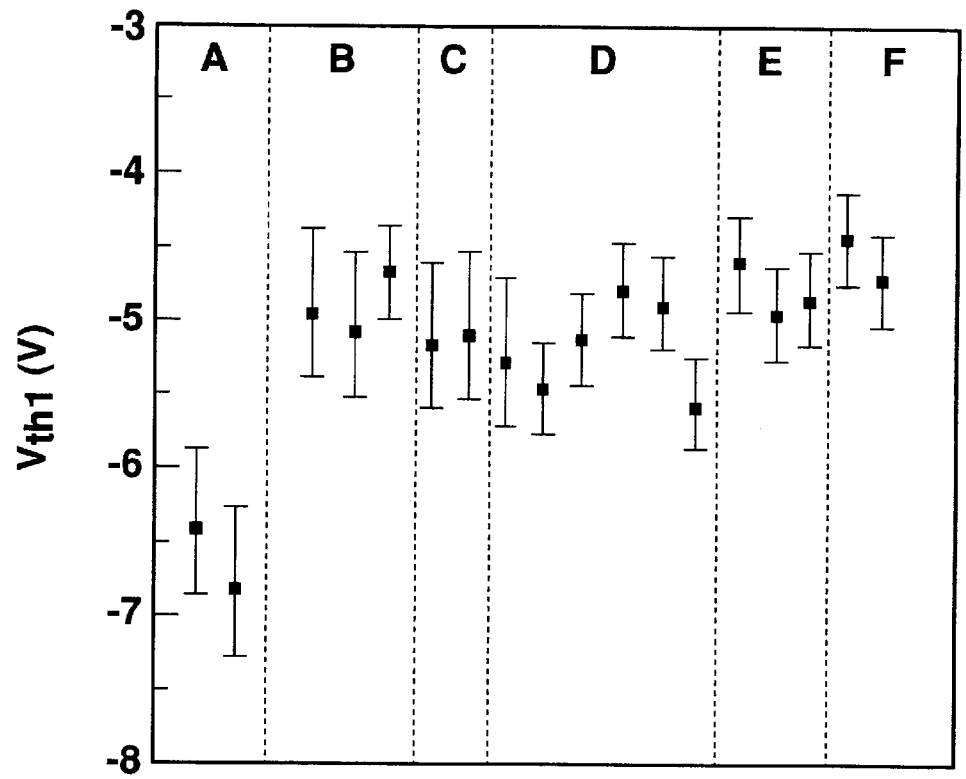

FIG. 9 is a characteristic graph showing values of the threshold ($V_{th1}$) when the drain voltage and current were −10V and −0.29 μA. From FIG. 9, it will understood that when annealing took place in a nitrogen atmosphere (groups B, C, D and E), the threshold ($V_{th1}$) showed a tendency to be low slightly (large in absolute value) compared to when a hydrogen plasma process took place (group F), but the values of the threshold were substantially the same level as the case of group F. Still in the case of groups B, C, D and E, the threshold ($V_{th1}$) was remarkably high (small in absolute value) compared to when annealing did not take place (group A).

Figure 10:
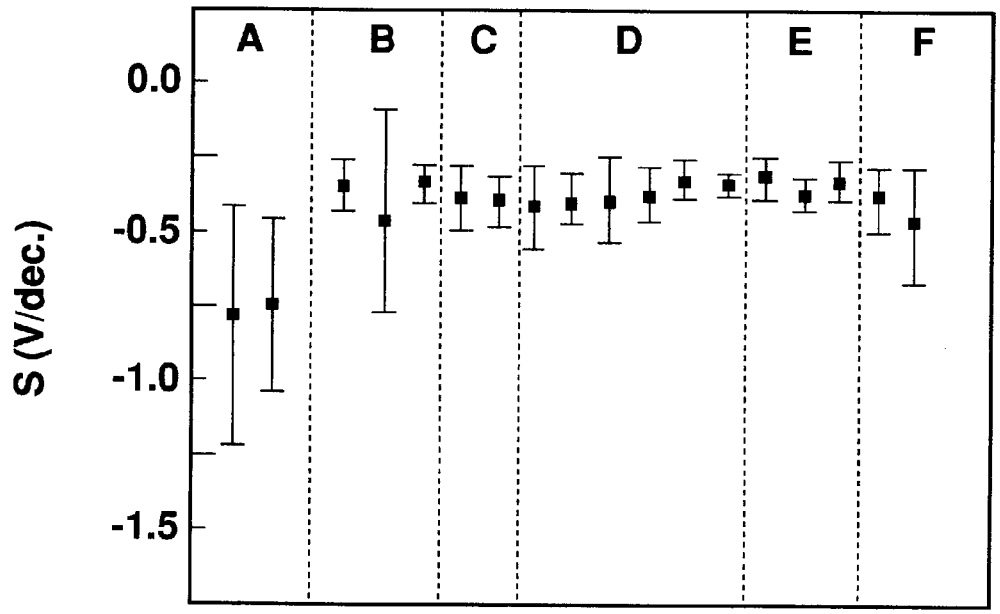

FIG. 10 is a characteristic graph showing values of the swing (S) representing a sub-threshold characteristic in terms of the change of the gate voltage when the drain voltage was −5V and the drain current was varied from $10^{-9}$ A to $10^{-8}$ A. From FIG. 10, it will be understood that generally when annealing took place in a nitrogen atmosphere at a temperature of 350° C. to 400° C. for two or three hours (groups C, D and E), the swing value (S) was large (small in absolute value) and was only slightly dispersed compared to the remaining groups, namely, when annealing in a nitrogen atmosphere took place but under a different condition (group B), when annealing did not take place (group A) and when a hydrogen plasma process took place (group F).

Figure 11:
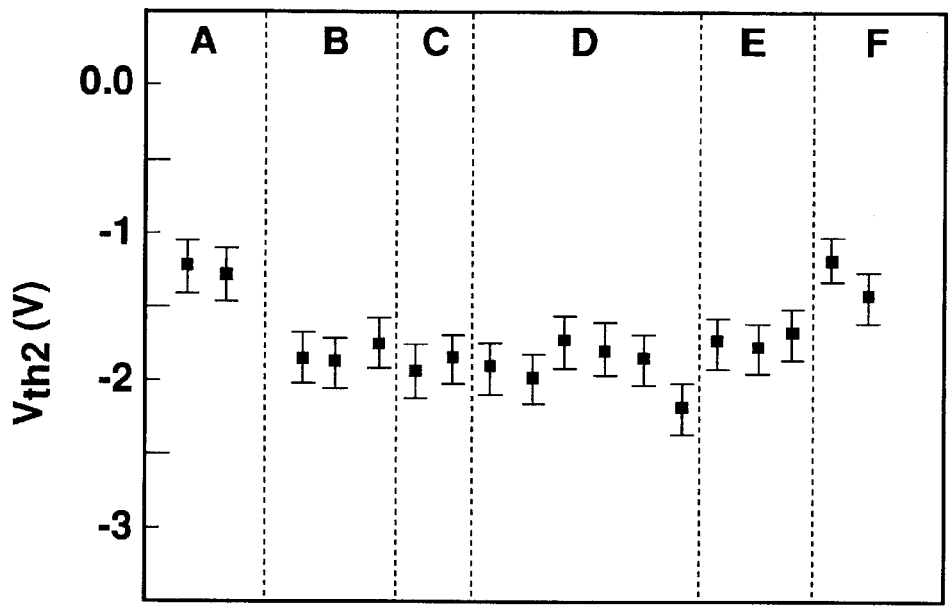

FIG. 11 is a characteristic graph showing values of the threshold ($V_{th2}$) when the drain voltage and current were −0.1V and −2.9 pA, respectively. From FIG. 11, it will be understood that generally when annealing took place in a nitrogen atmosphere (groups B, C, D and E), the threshold ($V_{th2}$) was low (large in absolute value) compared to the remaining groups, namely, when annealing in a nitrogen atmosphere did not take place (group A) and when a hydrogen plasma process took place (group F).

From the foregoing results, it will be understood that annealing in a nitrogen atmosphere and treating with a nitrogen plasma process are substantially equally effective in improving various electrical characteristics, except the threshold, of a p-channel thin film transistor. As is noted from FIG. 11, the threshold characteristic when the applied voltage was low was deteriorated due to the annealing in a nitrogen atmosphere instead of being improved. However, in a p-Si TFT liquid crystal display system with a driver integrated on same panel, since the p-channel TFT in question is used in the driver section in order to obtain a complementary metal oxide semiconductor device, the threshold characteristic when the applied voltage is low is not so significant. Further, if the n-channel TFT fabricated according to the method of FIGS. 2A to 2G is used as TFT in the display area of the liquid crystal display system, no detrimental effects would not be exerted, even on the display.

From the foregoing results of this experiment, it will be understood that annealing in a nitrogen atmosphere with no hydrogen plasma process was most effective in improving various electrical characteristics of a polysilicon thin film transistor (p-Si TFT) of either n-channel or p-channel, especially when such annealing was carried out at 400° C. for two hours.

Figure 12:
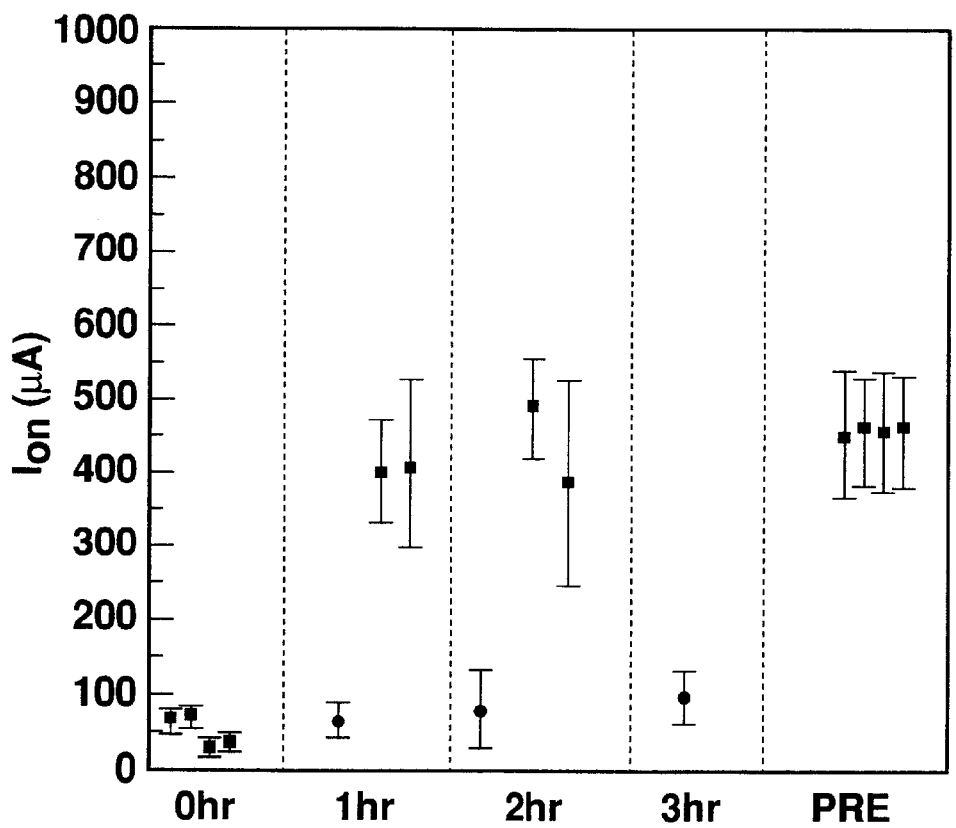
FIGS. 12, 13, 14 and 15 are characteristic graphs showing the parameters of TFTs fabricated respectively as the timing at which hydrogen is introduced into a polysilicon film is varied.
Figure 13:
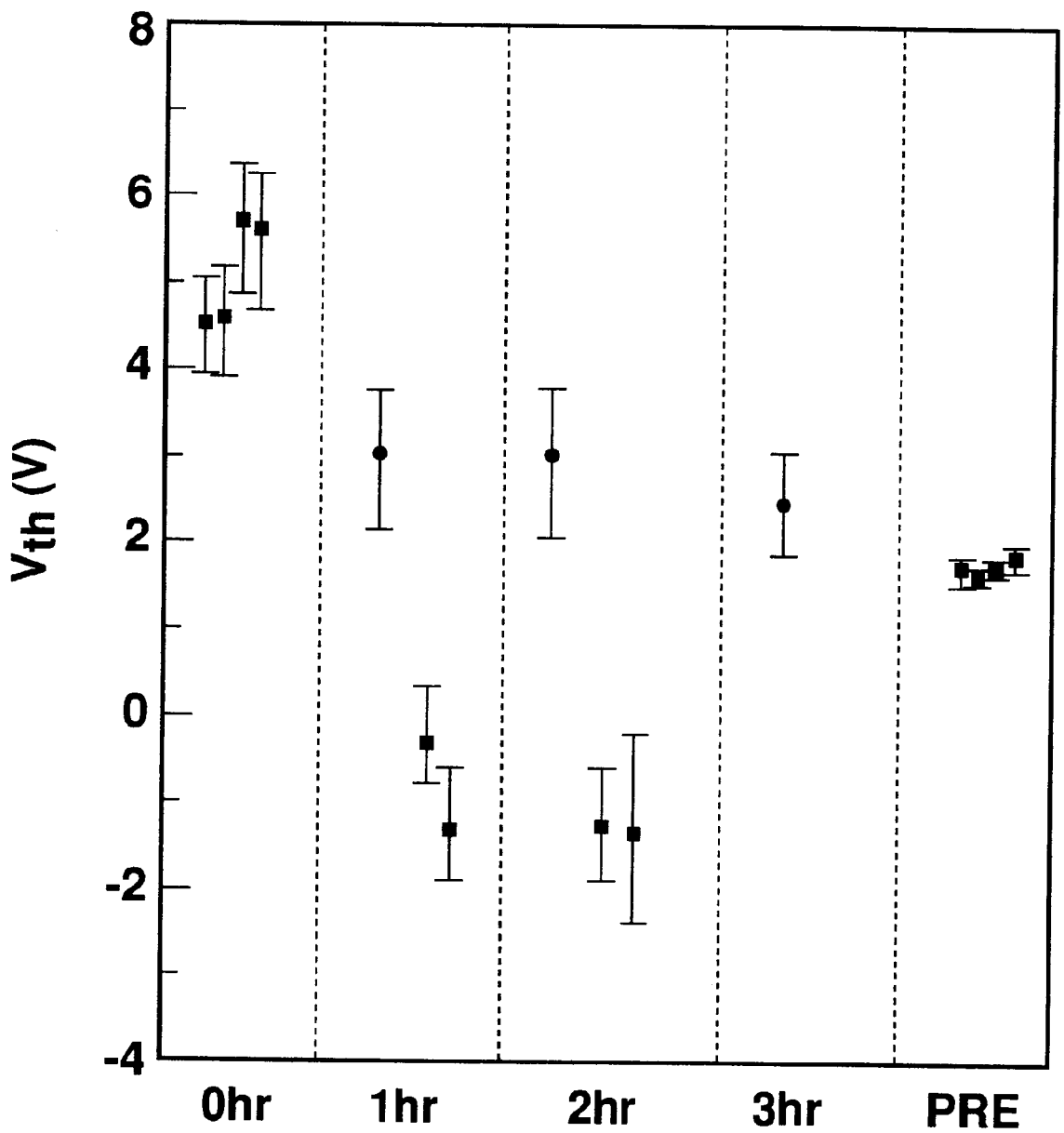
Figure 14:
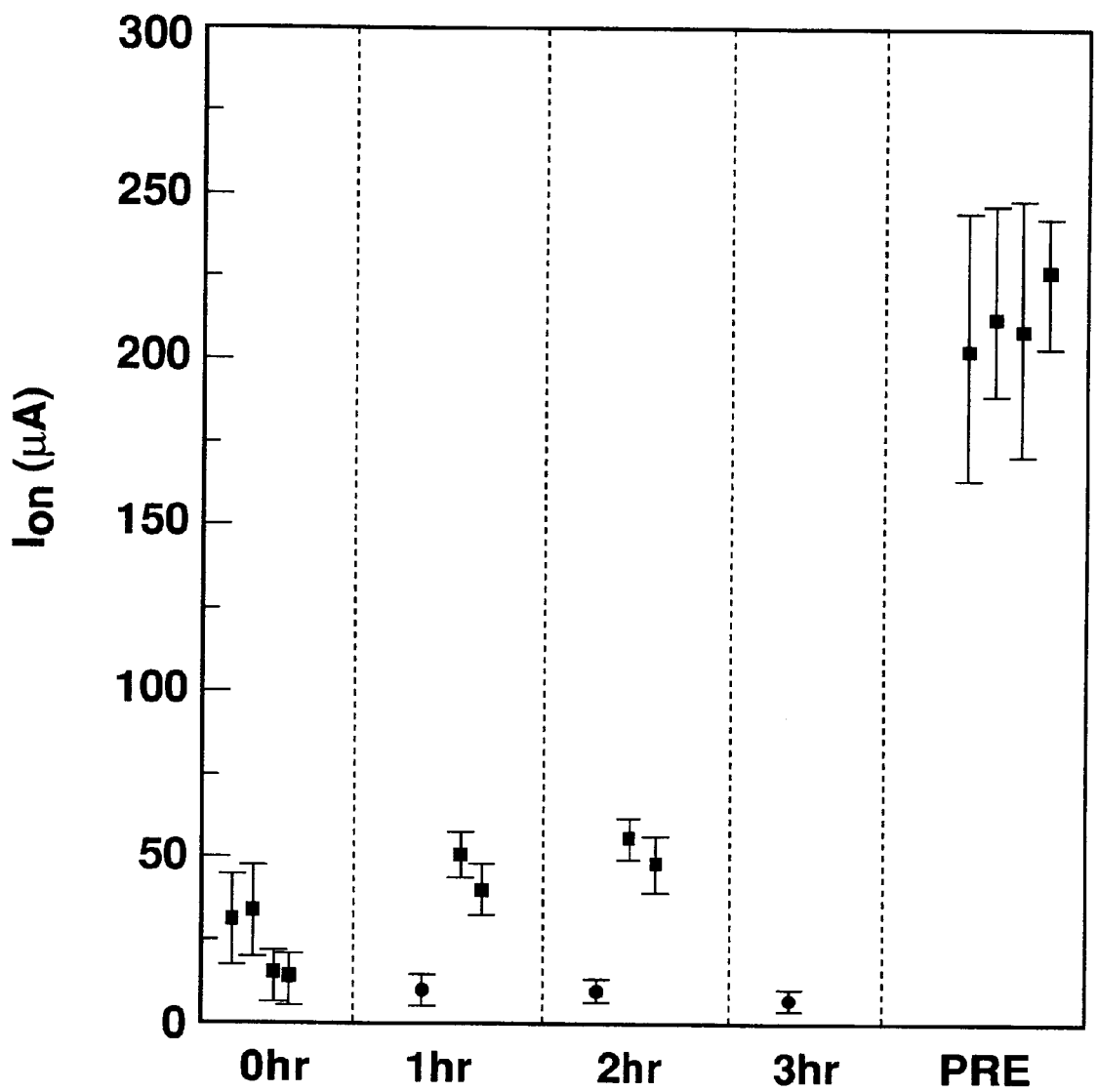
Figure 15:
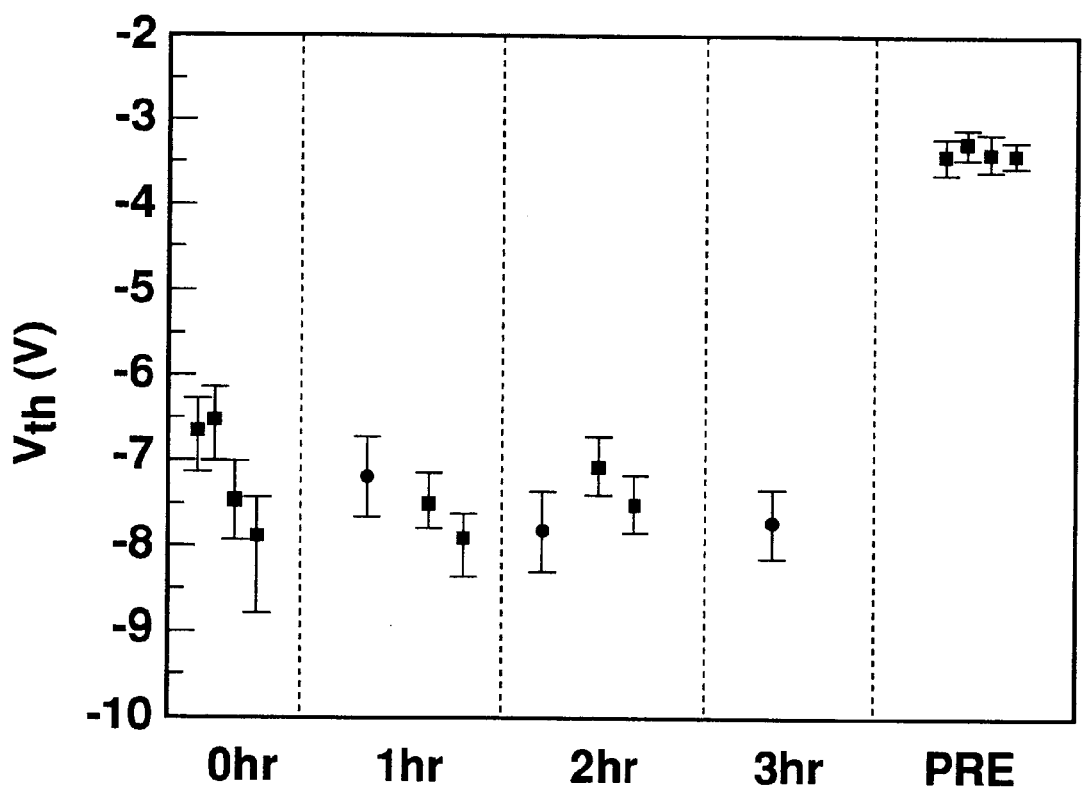

FIGS. 12 to 15 show the results of an inspection on the individual electrical characteristics (i.e., the on current $I_{on}$ and the operating threshold $V_{th}$) of each of ten TFTs with a p-Si film fabricated by annealing in a nitrogen atmosphere before and after formation of the source and drain electrodes 16, 17. The purpose of this inspection is to ascertain which stage of the process steps is optimal for an annealing nitrogen atmosphere in order to terminate the hydrogen atoms to dangling bonds in the p-Si film. FIGS. 12 and 13 are characteristic graphs showing the on current Ion and the threshold Vth, respectively, of each of n-channel TFTS. In this experiment, for every n-channel TFT, the channel width was 20 μm and the channel length was 7 μm and the LD length was 1 μm. FIGS. 14 and 15 are characteristic graphs showing the on current Ion and the threshold Vth, respectively, of each of p-channel TFTS. This type of TFT did not have an LDD structure. In each of FIGS. 12 to 15, ■ stands for the average values of each TFT treated by annealing in a nitrogen atmosphere at a temperature of 350° C. and ● stands for the average values of each TFT treated by annealing in a nitrogen atmosphere at a temperature of 300° C. Either symbol is associated with a sign indicating the range of dispersion. Shown on the horizontal axis of the graph of each of FIGS. 12 to 15 with respect to the annealing time on a hourly basis (0 hour, 1 hour, 2 hours and 3 hours) are values of the individual characteristics of each of the TFTs when annealing in a nitrogen atmosphere took place after formation of the source and drain electrodes 16, 17, and shown by PRE are values of the individual characteristics of each of the TFTs when a plasma nitride film was formed on the p-Si film 13 as an interlayer insulation film 15 and soon after that annealing in a nitrogen atmosphere took place, namely, the same values as those of the individual TFT of group D shown in FIGS. 4 and 5 and FIGS. 8 and 9.

FIG. 12, like FIG. 4, is a characteristic graph showing values of the on current ($I_{on}$) when either of the gate and drain voltages applied to the TFT was 15V. From FIG. 12, it will understood that when annealing in a nitrogen atmosphere took place at 350° C. for two hours[2hr], the values were equivalent to those of PRE of this embodiment.

FIG. 13, like FIG. 5, is a characteristic graph showing values of the threshold ($V_{th}$) when the drain voltage and current applied to the TFT were 10V and 0.29 μA, respectively. From FIG. 13, it will be understood that when annealing in a nitrogen atmosphere took place at 300° C., the values approximate to those of this embodiment were obtained, and when annealing in a nitrogen atmosphere took place at 350° C., the values of the threshold were negative values, which indicated that the semiconductor device was a depletion type.

It is also understood from FIG. 12 that only a small on current was not obtained when annealing took place at 300° C., and the threshold characteristic of TFT was a depletion type, which would not be qualified for a CMOS structure. In the process in which annealing in a nitrogen atmosphere took place after formation of the source and drain electrodes 16, 17, although the annealing temperature was within the range of 300° C. to 350° C., the margin was minimal and both the reproducibility and the yield were less reliable, and also, the characteristics were inferior to PRE of this embodiment.

FIG. 14, like FIG. 8, is a characteristic graph showing values of the on current ($I_{on}$) when either of the gate and drain voltages applied to the p-channel TFT was −15V. FIG. 15, like FIG. 9, is a characteristic graph showing values of the threshold ($V_{th}$) when the −10V drain voltage and −0.29 μA were applied to the p-channel TFT. From either FIG. 14 or FIG. 15, it will be understood that the individual characteristics fell far behind the characteristics of this embodiment with respect to either temperature or time.

From the foregoing results, it is noted that annealing in a nitrogen atmosphere should take place preferably at a specified stage immediately after the plasma nitride film has been formed on the p-Si film 13 and before the source and drain electrodes 16, 17 are formed.

Noting that the density of hydrogen is most likely to become too high in a fabrication method utilizing a hydrogen plasma process, the present inventors have assumed that any room to secure ideal electrical characteristics must exist in any other place and have reached the concept of weighing on effective termination of relatively small quantity of hydrogen in the p-Si film 13 to dangling bonds without increasing the hydrogen density too high in the p-Si film 13. To the end, in the dehydrogenation annealing process of FIG. 2B and in the structure covered with the plasma nitride film of FIG. 15, the temperature and time of annealing were set to the optimum to accomplish this object as shown in FIGS. 3 to 11. Away from the conditions disclosed in the foregoing embodiments, hydrogen would not have terminated the dangling bonds or the hydrogen once terminated to the dangling bonds would have been removed or separated, thus presumably lowering the efficiency of terminating hydrogen to dangling bonds.

In the foregoing embodiments, the dangling bonds of the semiconductor layer could be terminated efficiently by hydrogen. Consequently the on-off ratio of the transistor could be prevented from lowering due to the dangling bonds being trapped, and at the same time, excessive hydrogen could be prevented from remaining in the transistor and having adverse effects on the electrical characteristics, thus obtaining a high-performance semiconductor device.

Furthermore, according to the fabrication method of the present invention, since the hydrogenation process takes place along with the annealing process, it is possible to realize a reduction in the product price and the homogeneous semiconductor film at the same time, which could not have been expected from the conventional method utilizing a hydrogen plasma process. It is thus apparent that the present invention is not limited to the above embodiments and various modifications and changes may be suggested without departing from the scope and spirit of the invention.

What is claimed is:

1. A method of manufacturing a semiconductor device in which a number of hydrogen atoms contained in a semiconductor film is nearly equal to or less than the number of dangling bonds in the semiconductor film, said method comprising the steps of:
   (a) forming a semiconductor film on a surface of a substrate;
   (b) decreasing the density of the hydrogen atoms in the semiconductor film by removing the hydrogen atoms from the semiconductor film by an annealing process;
   (c) after decreasing the density of hydrogen, annealing so as to polycrystallize the semiconductor film, and subsequently doping the semiconductor film with impurities;
   (d) after doping, forming a silicon nitride film over the semiconductor film; and
   (e) annealing under predetermined conditions so as to supply hydrogen to the semiconductor film; wherein the density of the hydrogen atoms contained in the semiconductor film is approximately $5 \times 10^{20}$ atoms/cm$^3$.

2. A method of manufacturing a semiconductor device, comprising the steps of:
   (a) forming a semiconductor film on a surface of a substrate;
   (a') polycrystallizing the semiconductor film by laser annealing;
   (a") after polycrystallizing, doping the semiconductor film with impurities;
   (b) after doping, forming a silicon nitride film over the polycrystalline semiconductor film;
   (c) treating the substrate with a thermal annealing process after said forming of the silicon nitride film; and
   (d) subsequently forming electrical contacts to the semiconductor film through the silicon nitride film, wherein said thermal annealing process is carried out at a substrate temperature of approximately 350° C. to approximately 400° C. for one to three hour; wherein the density of the hydrogen atoms contained in the semiconductor film is approximately $5 \times 10^{20}$ atoms/cm$^3$.

3. A semiconductor device manufacturing method according to claim 2, wherein said forming of the silicon nitride film is carried out by Plasma CVD.

4. A semiconductor device manufacturing method according to claim 2, wherein said thermal annealing process is carried out at a substrate temperature of approximately 400° C. for approximately two hours.

5. A semiconductor device manufacturing method according to claim 2, wherein said thermal annealing process is carried out under nitrogen atmosphere.

6. A semiconductor device manufacturing method according to claim 2, wherein after said forming of the semiconductor film and before said forming of the silicon nitride film, the density of the hydrogen atoms contained in the semiconductor film is decreased by previously removing the hydrogen atoms from the semiconductor film by an annealing process.

7. A semiconductor device manufacturing method according to claim 6, wherein said semiconductor film is formed as amorphous silicon film on the substrate;
   said amorphous silicon film is annealed to decrease the density of hydrogen atoms, which are contained in the amorphous silicon film by removing the hydrogen atoms from the amorphous silicon film;
   a polysilicon film is formed by polycrystallizing the amorphous silicon film by another annealing process;
   the silicon nitride film is formed over the polysilicon film by plasma CVD; and
   the substrate is treated with a thermal-annealing process after said forming of the silicon nitride film.

8. A method of manufacturing a thin film transistor, comprising the steps of:
   (a) forming a gate electrode on a surface of a substrate;
   (b) forming a gate insulating film and a non-crystalline silicon film in the described order over the substrate so as to cover the gate electrode;
   (c) decreasing the density of hydrogen atoms, which are contained in the non-crystalline silicon film, by removing the hydrogen atoms from the non-crystalline silicon film by an annealing process;
   (d) forming a polysilicon film by polycrystallizing the non-crystalline silicon film by another annealing process;
   (e) patterning the polysilicon film in a predetermined shape and then forming an impurity-doped region at a predetermined area in the patterned polysilicon film;
   (f) after said forming of the impurity-doped region, forming a silicon nitride film so as to cover the patterned polysilicon film by plasma CVD and then treating the substrate, on which the polysilicon film and the silicon nitride film have been formed, with a thermal annealing process;
   (g) after said thermal annealing process, removing selected portions of the silicon nitride film in such a manner that a surface of the impurity-doped region in the polysilicon film is exposed; and
   (h) forming a source electrode and a drain electrode in the exposed portions of the impurity-doped region to thereby connect the source electrode and the drain electrode to the impurity-doped region at their corresponding portion; wherein the density of the hydrogen atoms contained in the polysilicon film is approximately $5 \times 10^{20}$ atoms/cm$^3$.

9. A thin film transistor manufacturing method according to claim 8, wherein said thermal annealing process is carried out at a substrate temperature of 350° C. to 400° C. for one to three hours.

10. A thin film transistor manufacturing method according to claim 8, wherein said thermal annealing process is carried out at a substrate temperature of approximately 400° C. for approximately two hours.

11. A thin film transistor manufacturing method according to claim 6, wherein said thermal annealing process is carried out under nitrogen atmosphere.

12. A method of manufacturing a thin film transistor comprising the steps of:
   (a) forming a gate electrode on a surface of a substrate;
   (b) forming a gate insulating film and a non-crystalline silicon film in the described order over the substrate so as to cover the gate electrode;
   (c) decreasing the density of hydrogen atoms, which are contained in the non-crystalline silicon film, by removing the hydrogen atoms from the non-crystalline silicon film by an annealing process;

(d) forming a polysilicon film by polycrystallizing the non-crystalline silicon film by another annealing process;

(e) patterning the polysilicon film in a predetermined shape and then forming an impurity-doped region at a predetermined area in the patterned polysilicon film;

(f) after said forming of the impurity-doped region, forming a silicon nitride film so as to cover the patterned polysilicon film by plasma CVD and then treating the substrate, on which the polysilicon film and the silicon nitride film have been formed, with a thermal annealing process;

(g) after said thermal annealing process, removing selected portions of the silicon nitride film in such a manner that a surface of the impurity-doped region in the polysilicon film is exposed; and (h) forming a source electrode and a drain electrode in the exposed portions of the impurity-doped region to thereby connect the source electrode and the drain electrode to the impurity-doped region at their corresponding portions;

wherein the number of hydrogen atoms contained in the polysilicon film; and wherein the density of the hydrogen atoms contained in the polysilicon film is approximately $5 \times 10^{20}$ atoms/cm³ nearly equal to or less than the number of dangling bonds in the polysilicon film.

13. A method of manufacturing a thin film transistor, comprising the steps of:

(a) forming a gate electrode on a surface of a substrate;

(b) forming a gate insulating film and a non-crystalline silicon film in the described order over the substrate so as to cover the gate electrode;

(c) decreasing the density of hydrogen atoms, which are contained in the non-crystalline silicon film, by removing the hydrogen atoms from the non-crystalline silicon film by an annealing process;

(d) forming a polysilicon film by polycrystallizing the non-crystalline silicon film by another annealing process;

(e) patterning the polysilicon film in a predetermined share and then forming an impurity-doped region at a predetermined area in the patterned polysilicon film;

(f) after said forming of the impurity-doped region, forming a silicon nitride film so as to cover the patterned polysilicon film by plasma CVD and then treating the substrate, on which the polysilicon film and the silicon nitride film have been formed, with a thermal annealing process;

(g) after said thermal annealing process, removing selected portions of the silicon nitride film in such a manner that a surface of the impurity-doped region in the polysilicon film is exposed; and (h) forming a source electrode and a drain electrode in the exposed portions of the impurity-doped, region to thereby connect the source electrode and the drain electrode to the impurity-doped region at their corresponding portions;

wherein said thermal annealing process is carried out at a substrate temperature of approximately 400° C. for approximately two hours; and wherein the density of the hydrogen atoms contained in the polysilicon film is approximately $5 \times 10^{20}$ atoms/cm³.

14. A method of manufacturing a semiconductor device, comprising the steps of:

(a) forming a semiconductor film on a surface of a substrate;

(a') polycrystallizing the semiconductor film by laser annealing;

(b) forming an impurity-doped region at a predetermined area in said semiconductor film;

(c) forming a silicon nitride film on said semiconductor film having said impurity-doped region formed therein;

(c') treating the substrate with a thermal annealing process;

(d) removing part of said silicon nitride film such that at least part of said impurity-doped region in said semiconductor film is exposed; and (e) forming a source electrode and a drain electrode in portions of said silicon nitride film where said silicon nitride film is removed to expose said impurity-doped region;

wherein said thermal annealing process is carried out at a substrate temperature of approximately 350° C. to approximately 400° C. for one to three hours; and wherein the density of the hydrogen atoms contained in the semiconductor film is approximately $5 \times 10^{20}$ atoms/cm³.

15. A method of manufacturing a semiconductor device, comprising the steps of:

(a) forming a semiconductor film on a surface of a substrate;

(a') polycrystallizing the semiconductor film by laser annealing;

(a") after polycrystallizing, doping the semiconductor film with impurities;

(b) after doping, forming a silicon nitride film directly over the polycrystalline semiconductor film; and (c) subsequently treating the substrate with a thermal annealing process, wherein said thermal annealing process is carried out at a substrate temperature of approximately 350° C. to approximately 400° C. for one to three hours; wherein the density of the hydrogen atoms contained in the semiconductor film is approximately $5 \times 10^{20}$ atoms/cm³.

* * * * *